United States Patent
Ishihara et al.

(10) Patent No.: US 8,796,753 B2
(45) Date of Patent: Aug. 5, 2014

(54) NONVOLATILE SEMICONDUCTOR STORAGE DEVICE

(71) Applicant: Kabushiki Kaisha Toshiba, Minato-ku (JP)

(72) Inventors: Takamitsu Ishihara, Yokohama (JP); Koichi Muraoka, Sagamihara (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/146,585

(22) Filed: Jan. 2, 2014

(65) Prior Publication Data

US 2014/0117433 A1 May 1, 2014

Related U.S. Application Data

(63) Continuation of application No. 12/339,993, filed on Dec. 19, 2008.

(30) Foreign Application Priority Data

Mar. 19, 2008 (JP) .................................. 2008-072107

(51) Int. Cl.
*H01L 29/423* (2006.01)
*H01L 27/115* (2006.01)

(52) U.S. Cl.
CPC .... *H01L 29/42324* (2013.01); *H01L 27/11521* (2013.01)
USPC ........................................................ 257/316

(58) Field of Classification Search
CPC .................... H01L 29/42324; H01L 27/11521
USPC .................................................. 257/316–321
See application file for complete search history.

(56) References Cited

U.S. PATENT DOCUMENTS

| 6,936,884 B2 | 8/2005 | Chae et al. |
| 2005/0035393 A1 | 2/2005 | Lung et al. |
| 2006/0073702 A1 | 4/2006 | Shone |
| 2007/0132004 A1 | 6/2007 | Yasuda et al. |
| 2009/0140317 A1 | 6/2009 | Rosmeulen |

FOREIGN PATENT DOCUMENTS

| JP | 11-8325 A | 1/1999 |
| JP | 2005-197363 | 7/2005 |
| JP | 2005-268756 | 9/2005 |

(Continued)

OTHER PUBLICATIONS

Office Action issued Jan. 19, 2011, in Korea Patent Application No. 10-2009-23093 (with English-language Translation).

(Continued)

*Primary Examiner* — Thomas L Dickey
(74) *Attorney, Agent, or Firm* — Oblon, Spivak, McClelland, Maier & Neustadt, L.L.P.

(57) ABSTRACT

According to an aspect of the present invention, there is provided a nonvolatile semiconductor storage device including: a semiconductor substrate; a source region and a drain region that are formed in the semiconductor substrate so as to be separated from each other and so as to define a channel region therebetween; a tunnel insulating film that is formed on the channel region; an insulative charge storage film that is formed on the tunnel insulating film; a conductive charge storage film that is formed on the insulative charge storage film so as to be shorter than the insulative charge storage film in a channel direction; an interlayer insulating film that is formed on the conductive charge storage film; and a gate electrode that is formed on the interlayer insulating film.

8 Claims, 9 Drawing Sheets

(56) References Cited

FOREIGN PATENT DOCUMENTS

| JP | 2006-269814 | 10/2006 |
| JP | 2007-5814 | 1/2007 |
| JP | 2007-273859 | 10/2007 |
| JP | 2008-118007 | 5/2008 |
| JP | 2009-141354 A | 6/2009 |
| KR | 10-0633820 | 7/2006 |
| KR | 10-0695423 | 12/2006 |

OTHER PUBLICATIONS

Notification of Reasons for Refusal issued Nov. 9, 2012 in Japanese Patent Application No. 2008-072107 (with English translation).
Office Action issued Mar. 8, 2013, in Japanese Patent Application No. 2012-285457 with English translation.

NONVOLATILE SEMICONDUCTOR STORAGE DEVICE

CROSS-REFERENCE TO RELATED APPLICATIONS

This is a continuation application of U.S. application Ser. No. 12/339,993, filed Dec. 19, 2008, which is based upon and claims the benefit of priority from Japanese Patent Application No. 2008-072107, filed on Mar. 19, 2008. The entire contents of the above applications are incorporated herein by reference.

BACKGROUND OF THE INVENTION

1. Field of the Invention

An aspect of the present invention relates to a nonvolatile semiconductor storage device and a method for manufacturing the same.

2. Description of the Related Art

NAND flash memory has a structure in which a plurality of nonvolatile semiconductor memory elements are connected in series. For example, a single element has a source region and a drain region formed on a surface of a semiconductor substrate, and a gate insulating film, a floating gate, an inter-gate insulating film, and a control gate that are sequentially stacked on a channel region sandwiched between the source region and the drain region. In a miniaturization of a nonvolatile semiconductor memory element using a floating gate, there are pointed out that it is difficult to reduce the height of the floating gate, that it is difficult to perform ion implantation for forming a diffusion layer or a channel, and that interference between transistors occur.

A MONOS (Metal-Oxide-Nitride-Oxide-Silicon) or SONOS (Silicon-Oxide-Nitride-Oxide-Silicon) type nonvolatile semiconductor storage device is available for solving the above-mentioned points resultant from pursuit of miniaturization of the structure (see JP-2005-268756-A). A term MONOS type will be used hereunder on behalf of the MONOS type and the SONOS type.

The MONOS-type nonvolatile semiconductor memory element is provided with an insulative charge storage layer formed of a silicon nitride film in place of a floating gate of a related-art structure. The nonvolatile semiconductor memory element is constituted of a source region and a drain region formed on the surface of a semiconductor substrate, and a tunnel insulating film, a charge storage layer formed of a silicon nitride film, an interlayer insulating film, and a control gate that are sequentially stacked on a channel region sandwiched between the source region and the drain region. In NAND-type flash memory, the above-mentioned points of the floating-gate-type nonvolatile semiconductor memory element can be solved by the MONOS-type nonvolatile semiconductor memory element.

However, in the MONOS-type element structure, it is difficult to improve a writing characteristic.

SUMMARY OF THE INVENTION

According to an aspect of the present invention, there is provided a nonvolatile semiconductor storage device including: a semiconductor substrate; a source region and a drain region that are formed in the semiconductor substrate so as to be separated from each other and so as to define a channel region therebetween; a tunnel insulating film that is formed on the channel region; an insulative charge storage film that is formed on the tunnel insulating film; a conductive charge storage film that is formed on the insulative charge storage film so as to be shorter than the insulative charge storage film in a channel direction; an interlayer insulating film that is formed on the conductive charge storage film; and a gate electrode that is formed on the interlayer insulating film.

According to another aspect of the present invention, there is provided a nonvolatile semiconductor storage device including: a semiconductor substrate; a source region and a drain region that are formed in the semiconductor substrate so as to be separated from each other and so as to define a channel region therebetween; and a laminated structure including: a tunnel insulating film that is formed on the channel region; an insulative charge storage film that is formed on the tunnel insulating film; a conductive charge storage film that is formed on the insulative charge storage film;

an interlayer insulating film that is formed on the conductive charge storage film; and a gate electrode that is formed on the interlayer insulating film, wherein the laminated structure is formed so that a width thereof becomes narrow continuously from the gate electrode toward the tunnel insulating film in a channel direction.

According to still another aspect of the present invention, there is provided a method for manufacturing a nonvolatile semiconductor storage device, the method including: sequentially forming, on a semiconductor substrate, a tunnel insulating film, an insulative charge storage film, a conductive charge storage film, an interlayer insulating film, and a gate electrode; patterning, at least, the tunnel insulating film, the insulative charge storage film, and the conductive charge storage film; forming a source region and a drain region in the semiconductor substrate; and processing the conductive charge storage film so as to be shorter than the insulative charge storage film in a channel direction.

DETAILED DESCRIPTION OF THE INVENTION

Embodiments of the present invention will be described in detail hereunder by reference to the drawings.

First Embodiment

Figure 1:
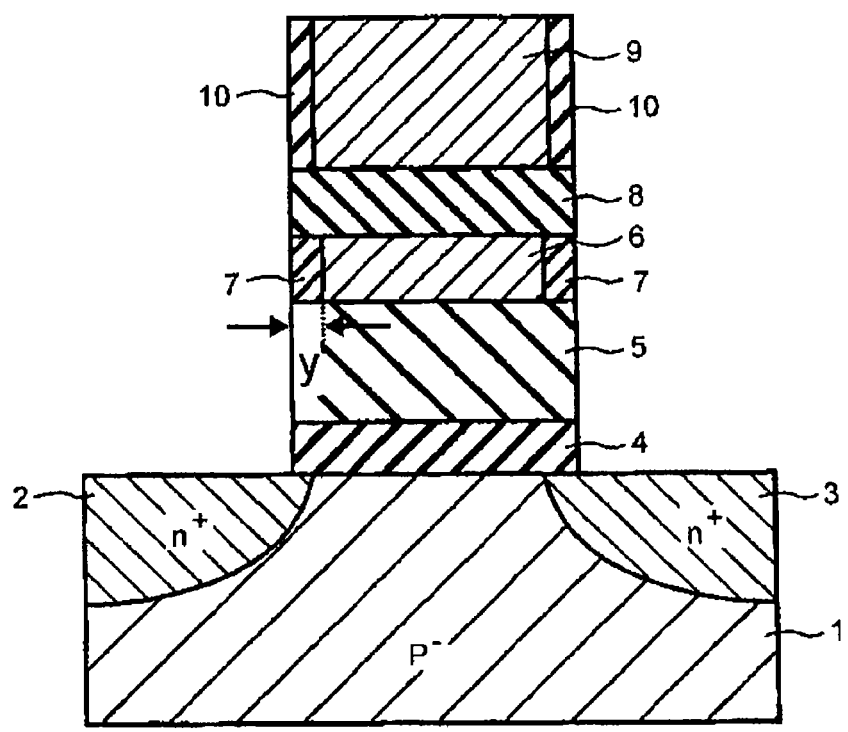
FIG. 1 is a cross-sectional view of a nonvolatile semiconductor storage device according to a first embodiment of the present invention.

FIG. 1 is a cross-sectional view of a nonvolatile semiconductor storage device according to a first embodiment of the present invention. The nonvolatile semiconductor storage device includes a semiconductor substrate 1 that is a first conductivity type (for example, a p⁻type), a source region 2 and a drain region 3 that are a second conductivity type (for example, an n⁺-type) and that are formed separately from each other within the semiconductor substrate 1. A portion of the semiconductor substrate 1 sandwiched between the source region 2 and the drain region 3 serves as a channel region. A sign "−" of "p⁻-type" signifies a low concentration of p-type impurity, and a sign "+" of "n⁺-type" signifies the high concentration of n-type impurity. The source region 2 and the drain region 3 are formed by implantation of, for instance, phosphor.

A tunnel insulating film 4 and an insulative charge storage layer 5 are stacked on the channel region of the semiconductor substrate 1. A conductive charge storage layer 6 that is shorter than the insulative charge storage layer 5 in a channel direction is provided on the insulative charge storage layer 5, and an insulating layer 7 is provided on either side of the conductive charge storage layer 6. An interlayer insulating film 8 and a control gate 9 are stacked on a layer consisting of the conductive charge storage layer 6 and the insulating layer 7. An insulating layer 10 is provided on either side of the control gate 9. Although not shown, on either or single side of the element shown in FIG. 1, elements having the same structure are provided in series. Select transistors for selecting a line of elements are provided on both sides of the series-connected elements.

In the embodiments, the channel direction signifies a current flowing direction between the source region and the drain region. For example, the channel direction corresponds to the shortest distance between the source region and the drain region.

The conductive charge storage layer is formed of, for example, polysilicon, metal, a metallic compound, and the like and is capable of storing electric charges of holes or electrons. For instance, titanium, tungsten, and the like, can be used as metal. In addition to metal silicide, a nitride, a carbide, and a boride, and the like, can be used as the metallic compound. The insulative charge storage layer is formed of, for example, a silicon nitride film, a high permittivity film, such as HfSiON, and is capable of storing electric charges, for example, by trapping electrons.

It is preferable to use metal having work function greater than that of polysilicon as the conductive charge storage layer 6. A silicon oxide film, a high permittivity insulating film, and the like, can be used as the insulating film 7. A film having a low permittivity is preferable. For instance, cavities 7b (indicated by reference numeral 7b in FIGS. 5 through 9 to be described later) having relative permittivity of 1 are preferably used. The tunnel insulating film 4 is formed of, for example, a silicon oxide film or a silicon oxynitride film. The insulative charge storage layer 5 is formed of, for example, a silicon nitride film or a high permittivity film. For instance, alumina is used for the interlayer insulating film 8. Polysilicon, Metal, such as Ta and Ti, is used for the control gate 9. For instance, the tunnel insulating film 4 is formed to a thickness of 4 nm; the insulative charge storage layer 5 is formed to a thickness of 3 nm; the layer consisting of the conductive charge storage layer 6 and the insulating layer 7 is formed to a thickness of 2 nm; the interlayer insulating film 8 is formed to a thickness of 6 nm; and the control gate 9 is formed to a thickness of 0.1 µm.

In order to write data into the nonvolatile semiconductor storage device according to the embodiment, a write voltage is applied to the control gate 9, thereby implanting electric charges (electrons or holes) into the insulative charge storage layer 5 from the semiconductor substrate 1 through a tunnel insulating film. Since the electric charges migrate between the insulative charge storage layer 5 and the conductive charge storage layer 6, the electric charges are stored in the conductive field storage layer 6, as well. When the electric charges are stored in the insulative charge storage layer 5 and the conductive charge storage layer 6, a threshold voltage of the element is changed according to the charged condition (whether or not electric charges are stored or the electric charge amount). By using the fact, written data are read. In order to delete the data, an erase voltage is applied between the semiconductor substrate 1 and the control gate 9, thereby drawing the electric charges stored in the insulative charge storage layer 5 and the conductive charge storage layer 6 toward the semiconductor substrate 1.

Figure 2:
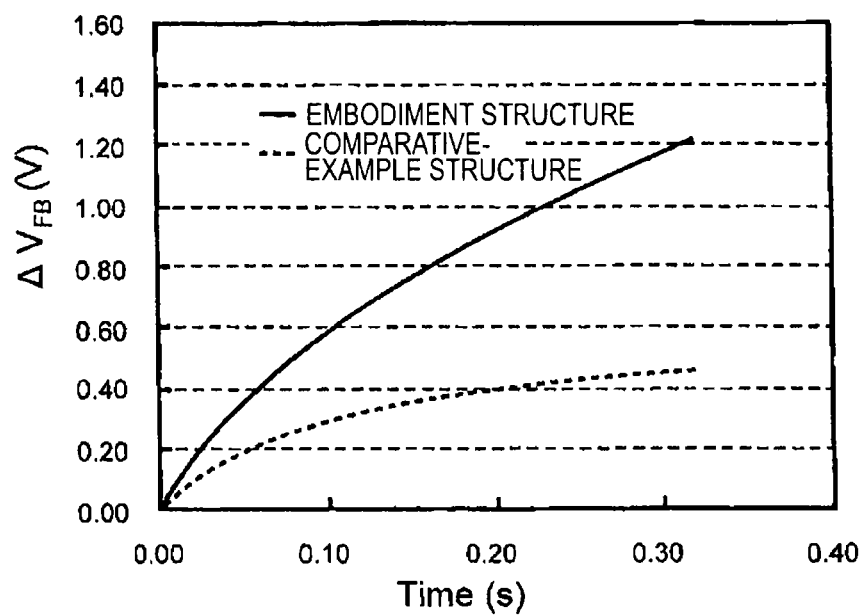
FIG. 2 is a view showing a write characteristic of the nonvolatile semiconductor storage device according to the first embodiment.

According to the embodiment, the conductive charge storage layer 6 is formed on the insulative charge storage layer 5 in order to increase the charge storing amount. Since the conductive charge storage layer 6 is formed of polysilicon, metal, a metallic compound, and a mixture of metal and polysilicon, a large state density is achieved, and large amount of electric charges can be stored. Since the charge storing amount is increased, the writing characteristic of the nonvolatile semiconductor storage device can be enhanced. Next, a characteristic of the nonvolatile semiconductor storage device according the embodiment is exemplary shown. FIG. 2 is a view showing write characteristics of the nonvolatile semiconductor storage device (hereinafter referred to as a "embodiment structure") having a layered structure of an insulative charge storage layer and a conductive charge storage layer as a charge storage layer, and of a nonvolatile semiconductor storage device (hereinafter referred to as a "comparative-example structure") having the insulative charge storage layer as a charge storage layer. FIG. 2 shows variations $\Delta V_{FB}$ in a flat band voltage attained with respect to a voltage application time when a voltage is applied to the control gate according to the embodiment structure and the control gate of the comparative-example structure.

In the embodiment structure, a tunnel insulating film 4, the insulative charge storage layer 5, the conductive charge storage layer 6, the interlayer insulating film 8, and the control gate 9 are stacked on the semiconductor substrate 1. The tunnel insulating film 4 has a thickness of 4 nm; the insulative charge storage layer 5 has a thickness of 3 nm; the conductive charge storage layer 6 has a thickness of 2 nm; the interlayer insulating film 8 has a thickness of 6 nm; and the control gate 9 has a thickness of 0.1 µm. Further, the tunnel insulating film 4 is formed of silicon oxide; the insulative charge storage layer 5 is formed of silicon nitride; the conductive charge storage layer 6 is formed of aluminum; the interlayer insulating film 8 is formed of alumina; and the control gate 9 is formed of polysilicon. In the comparative-example structure, a tunnel insulating film, an insulative charge storage layer, an interlayer insulating film, and a control gate are stacked on the semiconductor substrate. The tunnel insulating film has a thickness of 4 nm; the charge storage layer has a thickness of 5 nm; the interlayer insulating film has a thickness of 6 nm; and the control gate has a thickness of 0.1 µm. The tunnel insulating film is formed of silicon oxide; the insulative charge storage layer is formed of silicon nitride; the interlayer insulating film is formed of alumina; and the control gate is formed of polysilicon. Specifically, the embodiment structure and the comparative-example structure differ from each other in terms of the charge storage layer being formed into a two-layer structure of an insulative charge storage layer and a conductive charge storage layer as well as of the charge storage layer being formed into a single layer; that is, an insulative charge storage layer. In other respects, the structures are identical with each other.

In FIG. 2, a horizontal axis represents a time (s) during which a voltage is applied to the control gate, and a vertical axis represents a changing amount $\Delta V_{FB}$ (V) in flat band voltage induced by implantation of electrons into the charge storage layer. The voltage applied to the control gate is 18V. As the changing amount $\Delta V_{FB}$ (V) in flat band voltage becomes greater, the greater amount of electrons are implanted into the charge storage layer, and a write characteristic of the nonvolatile semiconductor storage device becomes higher. It is seen from FIG. 2 that the embodiment structure exhibits a greater changing amount $\Delta V_{FB}$ in flat band voltage than that of the comparative-example structure and that an increase in the amount of electric charge and improvements in write characteristic are attained.

Further, as another effect yielded by the embodiment structure, occurrence of a leakage current between the insulative charge storage layer 5 and the control gate 9 through the interlayer insulating film 8 can be prevented by forming the conductive charge storage layer 6 on the insulative charge storage layer 5.

As shown in FIG. 1, the nonvolatile semiconductor storage device according to the embodiment is formed such that the conductive charge storage layer 6 laid on the insulative charge storage layer 5 is formed so as to become shorter than the tunnel insulating film 4, the insulative charge storage layer 5, and the interlayer insulating film 8 in the channel direction and such that the insulating layer 7 is formed on either side of the conductive charge storage layer 6. An effect yielded by forming the insulating layer 7 on either side of the conductive charge storage layer 6 is as follows.

As a distance between adjacent elements of the nonvolatile semiconductor storage device becomes shorter as a result of miniaturization, the capacitance between conductive charge storage layers 6 of adjacent elements increases, and interference between the adjacent elements becomes greater. In the embodiment, in order to inhibit occurrence of interference between the adjacent elements, the insulating layer 7 is formed on either side of the conductive charge storage layer 6 on the insulative charge storage layer 5, and the conductive charge storage layer 6 is formed so as to become shorter than the tunnel insulating film 4, the insulative charge storage layer 5, and the interlayer insulating film 8 in the channel direction. As will be described later, the insulating layer 10 may not be provided so that the conductive charge storage layer 6 becomes shorter than the control gate 9 in the channel direction.

Figure 3:
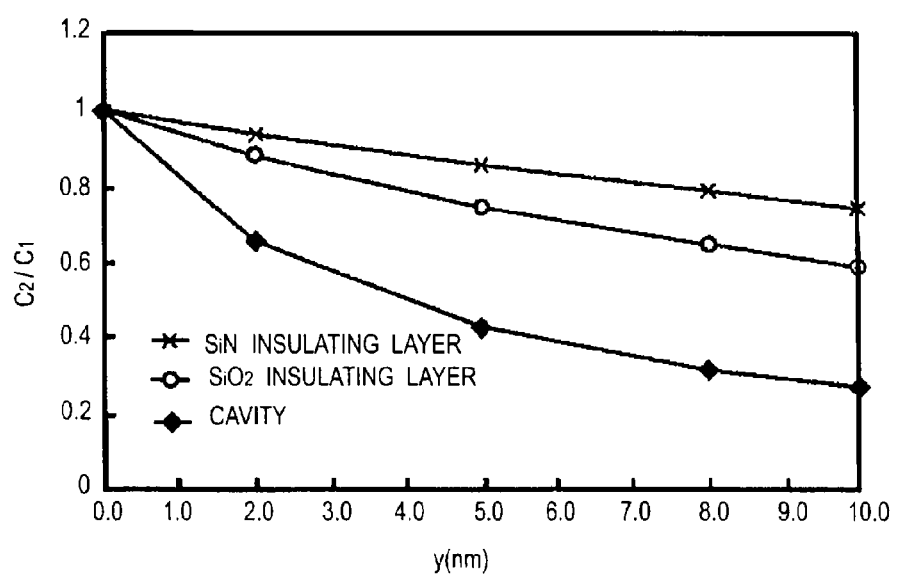
FIG. 3 is a view showing a capacitance characteristic between adjacent elements of the nonvolatile semiconductor storage device according to the first embodiment.

Next, an interference prevention characteristic between adjacent elements archived in the embodiment will be described. FIG. 3 is a view showing the ratio of the capacitance C1 between the conductive charge storage layers 6 of adjacent elements when neither the insulating layers 7 nor the cavities 7b are formed and the capacitance C2 between the conductive charge storage layers of adjacent elements when the insulating layers 7 or the cavities 7b are formed. In the nonvolatile semiconductor storage device having neither the insulating layers 7 nor the cavities 7b, a tunnel insulating film, an insulative charge storage layer, a conductive charge storage layer, an interlayer insulating film, and a control gate are stacked on a semiconductor substrate. The tunnel insulating film is formed to a thickness of 4 nm; the insulative charge storage layer is formed to a thickness of 3 nm; the conductive charge storage layer is formed to a thickness of 2 nm; the interlayer insulating film is formed to a thickness of 6 nm; and the control gate is formed a thickness of 0.1 μm. The tunnel insulating film is made of a silicon oxide film; the insulative charge storage layer is formed of a silicon nitride film; the conductive charge storage layer is formed of aluminum; the interlayer insulating film is formed of alumina; and the control gate is formed of polysilicon. A distance between adjacent elements in the nonvolatile semiconductor storage device is formed to 30 nm. In the meantime, in the nonvolatile semiconductor storage device having the insulating layer 7 or the cavity 7a formed on both sides of the conductive charge storage layer 6, the tunnel insulating film, the insulative charge storage layer, the conductive charge storage layer with the insulating layer 7 or the cavity 7b formed on both sides thereof, the interlayer insulating film, and the control gate are stacked. In both cases, the materials and the thicknesses of the tunnel insulating film, the insulative charge storage layer, the conductive charge storage layer, the interlayer insulating film and the control gate, and the distance between adjacent elements are the same. In FIG. 3, a horizontal axis represents the channel direction length "y" (nm) of the insulating layer 7 and the cavity 7b, and a vertical axis represents a ratio C2/C1 between the capacitance C2 and the capacitance C1. In FIG. 3, measurement results of C2/C1 in cases where a silicon oxide is formed as the insulating layer 7, where a silicon nitride is formed as the insulating layer 7 and where the cavity 7b is formed.

FIG. 3 shows that the capacitance C2 is smaller than the capacitance C1. FIG. 3 also shows that the capacitance C2 becomes minimum when the cavity 7b is used and becomes smaller in sequence of use of a silicon oxide film and a silicon nitride film. A permittivity becomes smaller in sequence of the cavity 7b, the silicon oxide film, and the silicon nitride film. Therefore, it is understood that the capacitance C can be made smaller when a low permittivity substance is used for the insulating layer 7. In particular, it is understood that a great reduction in capacitance can be attained when the cavity 7b is formed.

In the nonvolatile semiconductor storage device according to the embodiment, the insulating layer 7 is provided on either side of the conductive charge storage layer 6. As a result, the capacitance between the conductive charge storage layers 6 of adjacent elements is prevented from being increased, and interference between the elements can be prevented.

In the embodiment, the conductive charge storage layer 6 is shorter than the insulative charge storage layer 5 in the channel direction. When both the conductive charge storage layer 6 and the insulative charge storage layer 5 are shortened in the channel direction, a total charge storing amount becomes smaller, and the write characteristic becomes lower. In the meantime, the permittivity of the insulative charge storage layer 5 formed of an insulating film, such as a silicon nitride film, is smaller than the permittivity of the conductive charge storage layer 6 formed of polysilicon, metal, a metallic compound, and the like. Consequently, interference between the insulative charge storage layers 5 is smaller than interference between the conductive charge storage layers 6. Accordingly, in order to achieve both of an enhancement of the write characteristic attributable to an increase of stored electric charges and an inhibition of interference between elements, the conductive charge storage layer 6 is formed to be shorter than the insulative charge storage layer 5 in the channel direction.

Processes for manufacturing the nonvolatile semiconductor storage device according to the embodiment will be described. FIGS. 4A to 4D are cross-sectional views showing processes for manufacturing the nonvolatile semiconductor storage device.

Figure 4A:
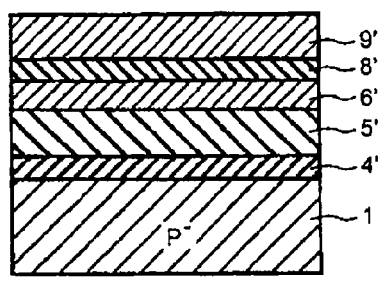
FIGS. 4A to 4D are cross-sectional views showing processes for manufacturing the nonvolatile semiconductor storage device according to the first embodiment.

First, as shown in FIG. 4A, a silicon oxide film 4', which is to turn into a tunnel insulating film 4 and which has a thickness of 4 nm, is formed on a semiconductor substrate 1 doped with p-type impurities by thermal oxidation. Next, a silicon nitride film 5', which is to turn into the insulative charge storage layer 5 and which has a thickness of 3 nm, is formed on the silicon oxide film 4' by, for example, CVD (Chemical Vapor Deposition). Next, a titanium film 6', which is to turn into the conductive charge storage layer 6, is formed by, for example, CVD. Next, an alumina film 8' of a thickness of 6 nm, which is to turn into the interlayer insulating film 8, is formed on the titanium film 6' by, for example, sputtering. Subsequently, a polysilicon film 9', which is to turn into the control gate 9, is formed on the alumina film 8' by CVD. Consequently, as shown in FIG. 4A, the silicon oxide film 4', the silicon nitride film 5', the titanium film 6', the alumina film 8', and the polysilicon film 9' are stacked on the p⁻-type semiconductor substrate 1.

Figure 4B:
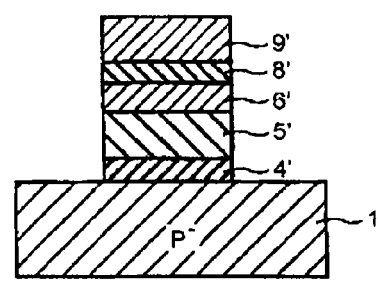

Next, as shown in FIG. 4B, the silicon oxide film 4', the silicon nitride film 5', the titanium film 6', the alumina film 8', and the polysilicon film 9' are subjected to gate patterning by lithography, thereby uncovering areas where the source region 2 and the drain region 3 are to be formed. Consequently, a layered structure of the tunnel insulating film 4 formed of a silicon oxide, the insulative charge storage layer 5 formed of a silicon nitride, the conductive charge storage layer 6 formed of titanium, the interlayer insulating film 8 formed of alumina, and the control gate 9 formed of polysilicon is formed on the p⁻-type silicon semiconductor substrate 1.

Figure 4C:
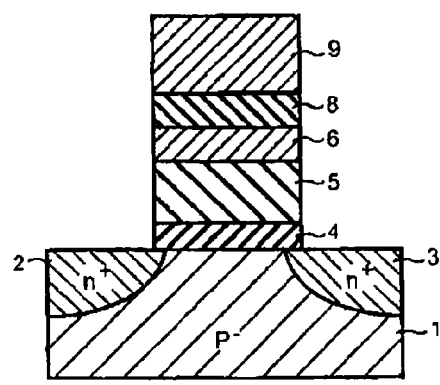
Figure 4D:
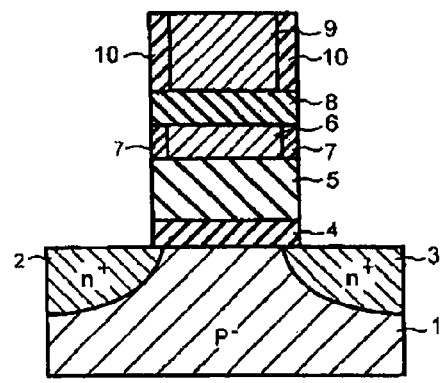

As shown in FIG. 4C, n-type impurity ions, such as phosphor ions, are implanted into the surface of the p⁻-type semiconductor substrate 1 using the layered structure as a mask, thereby forming the n⁺-type source region 2 and the drain region 3. Next, the layered structure (the tunnel insulating film 4, the insulative charge storage layer 5, the conductive charge storage layer 6, the interlayer insulating film 8, and the control gate 9) formed on the semiconductor substrate 1 is oxidized, thereby oxidizing both sides of the control gate 9 and both sides of the conductive charge storage layer 6. A known method can be used for the oxidizing method. For instance, steam oxidation, oxidation using ozone or oxygen radicals, or the like, can be used. Consequently, as shown in FIG. 4D, metal oxide films (titanium oxide films) 7 are formed as the insulating layers 7 on both sides of the conductive charge storage layer 6. An oxide of a metal constituting the conductive charge storage layer 6 is formed on both sides of the conductive charge storage layer 6. Moreover, the insulating layers 10 of a silicon oxide film are formed on both sides of the control gate 9. Furthermore, insulating films (not shown) of a silicon oxide film are formed, by CVD using TEOS (Tetraethoxysilane), on both sides of the layered structure consisting of the tunnel insulating film 4, the charge storage layer 5, the conductive charge storage layer 6, the interlayer insulating film 8, and the control gate 9. The nonvolatile semiconductor storage device according to the first embodiment shown in FIG. 1 is formed through the foregoing manufacturing processes.

First Modification of the First Embodiment

Figure 5:
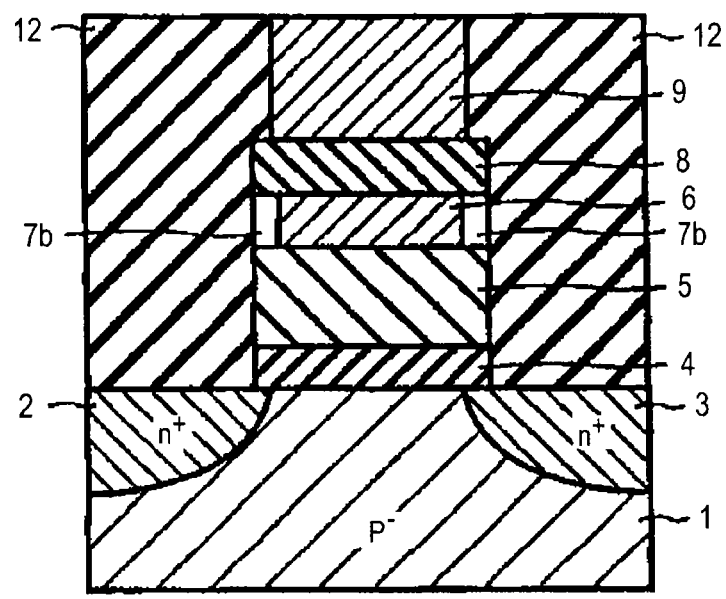
FIG. 5 is a cross-sectional view of a nonvolatile semiconductor storage device according to a first modification of the first embodiment.

A first modification of the first embodiment will now be described. FIG. 5 is a cross-sectional view of a nonvolatile semiconductor storage device according to the first modification of the first embodiment. The first modification differs from the first embodiment in that the cavities 7b are formed on both sides of the conductive charge storage layer 6 instead of the insulating layers 7.

In the nonvolatile semiconductor storage device according to the first modification of the first embodiment, the tunnel insulating film 4 and the insulative charge storage layer 5 are formed on the semiconductor substrate 1. The conductive charge storage layer 6 that is shorter than the insulative charge storage layer 5 in the channel direction is formed on the insulative charge storage layer 5, and the cavities 7b is formed on both sides of the conductive charge storage layer 6. The interlayer insulating film 8 is formed on the conductive charge storage layer 6. The control gate 9 is formed on the interlayer insulating film 8. A sidewall insulating film 12 is formed on either side of the layered structure of the tunnel insulating film 4, the insulting charge storage layer 5, the conductive charge storage layer 6 with the cavities 7b formed on both sides thereof, the interlayer insulating film 8, and the control gate 9 formed on the semiconductor substrate 1.

Figure 6A:
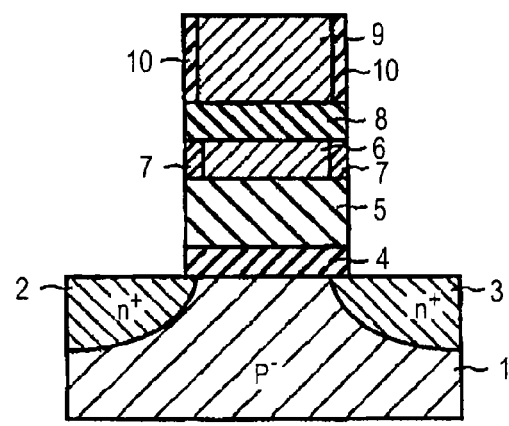
FIGS. 6A to 6C are cross-sectional views showing processes for manufacturing the nonvolatile semiconductor storage device according to the first modification of the first embodiment.
Figure 6B:
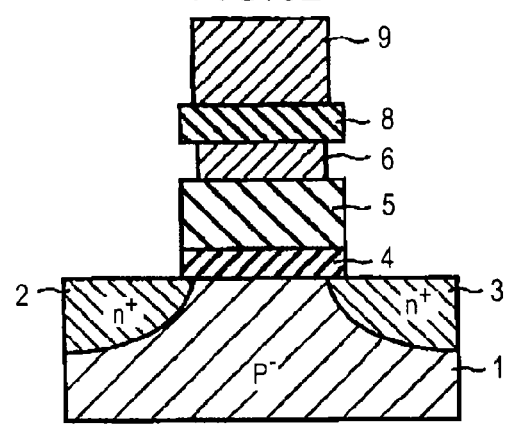
Figure 6C:
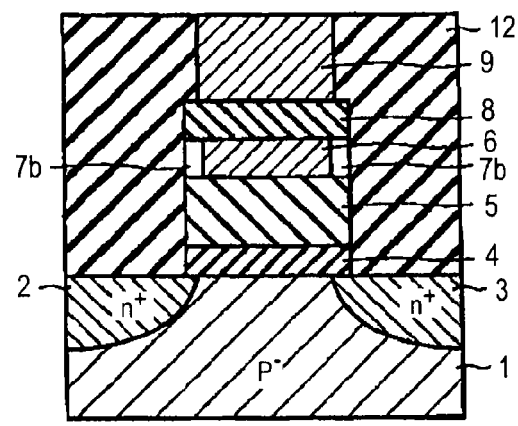

Processes for manufacturing the nonvolatile semiconductor storage device according to the first modification of the first embodiment will now be described. FIGS. 6A to 6C are cross-sectional views showing processes for manufacturing the nonvolatile semiconductor storage device according to the modification of the embodiment. The processes according to the first modification differ from those of the first embodiment in that the processes have a step of forming the cavity 7b on the side surfaces of the conductive charge storage layer 6.

First, as shown in FIG. 6A, a layered structure consisting of the tunnel insulating film 4, the insulative charge storage layer 5, the conductive charge storage layer 6 with the metallic oxide films (the titanium oxide films) 7 on both sides thereof, the interlayer insulating film 8, and the control gate 9 with the insulating layers 10 of a silicon oxide film on both sides thereof is formed on the semiconductor substrate 1 under the manufacturing method shown in FIGS. 4A through 4D. Next, the metallic oxide films formed on both sides of the conductive charge storage layer 6 and the silicon oxides film formed on both sides of the control gate 9 are selectively etched away. Thus, as shown in FIG. 6B, the tunnel insulating film 4, the insulative charge storage layer 5, the conductive charge storage layer 6, the interlayer insulating film 8, and the control gate 9 are formed in a stacked manner on the semiconductor substrate 1, thereby forming a structure in which the conductive charge storage layer 6 and the control gate 9 are shorter than the tunnel insulating film 4, the insulative charge storage layer 5, and the interlayer insulating film 8 in the channel direction. The insulating layers 10 formed on both sides of the control gate 9 may also be left as required.

As shown in FIG. 6C, the insulating films 12 of a silicon oxide film are formed on both sides of the layered structure (the tunnel insulating film 4, the charge storage layer 5, the conductive charge storage layer 6, the interlayer insulating film 8, and the control gate 9) by, for example, CVD using TEOS. Here, the insulating film 12 is formed to be in contact with both sides of the control gate 9, and to form the cavities 7b on both sides of the conductive charge storage layer 6. Since the conductive charge storage layer 6 is formed to be shorter than the interlayer insulating film 8 and the charge storage layer 5 in the channel direction, the cavities 7b can be formed on both sides of the conductive charge storage layer 6, and insulating films 12 are not formed thereon. As a result of consequence of the foregoing manufacturing processes, the nonvolatile semiconductor storage device according to the first modification of the first embodiment is fabricated as shown in FIG. 5.

The nonvolatile semiconductor storage device according to the first modification of the first embodiment has the same advantage as that of the first embodiment.

In the first modification of the first embodiment, when the cavities 7b are formed, both sides of the conductive charge storage layer 6 are oxidized, and resultant metallic oxides (titanium oxide films) 7 formed on both sides of the conductive charge storage layer 6 are etched away, to thus form the cavities. However, the cavities 7b may also be formed by selectively, directly etching both sides of the conductive charge storage layer 6 with respect to the insulative charge storage layer 5 by etching using a halogen-based element, such as chlorine.

Second Modification of the First Embodiment

Figure 7:
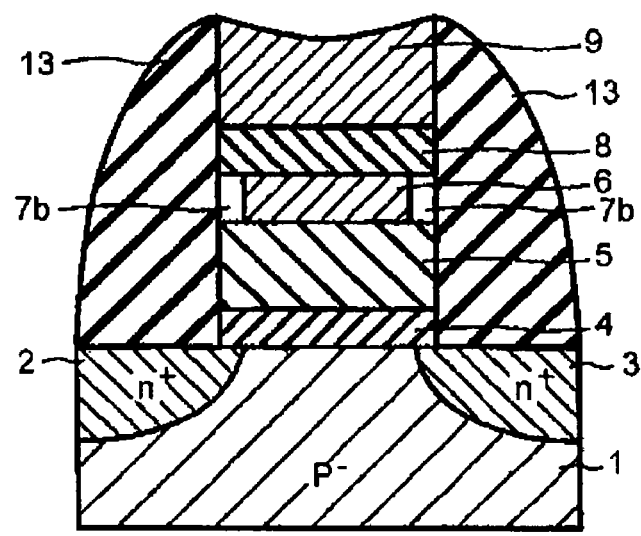
FIG. 7 is a cross-sectional view of a nonvolatile semiconductor storage device according to a second modification of the first embodiment.

A nonvolatile semiconductor storage device according to a second modification of the first embodiment will now be described. FIG. 7 is a cross-sectional view of a nonvolatile semiconductor storage device according to the second modification of the first embodiment. The second modification differs from the first embodiment in that the cavities 7b are formed on both sides of the conductive charge storage layer 6 instead of the insulating layers 7, in that the control gate 9 is formed to have the same length with the tunnel insulating film 4, the insulative charge storage layer 5, and the interlayer insulating film 8 in the channel direction, and in that the control gate 9 is formed to be longer than the conductive charge storage layer 6 in the channel direction. In the first embodiment and the first modification thereof, the control gate 9 is formed to be shorter than the tunnel insulating film 4, the insulative charge storage layer 5, and the interlayer insulating film 8 in the channel direction. By forming the control gate 9 to be longer in the channel direction, an effect of the voltage applied to the control gate 9 to the semiconductor substrate can be enhanced.

In the nonvolatile semiconductor storage device according to the second modification of the first embodiment, the tunnel insulating film 4 and the insulative charge storage layer 5 are formed on the semiconductor substrate 1. The conductive charge storage layer 6 that is shorter than the insulative charge storage layer 5 in the channel direction is formed on the insulative charge storage layer 5, and the cavities 7b are formed on both sides of the conductive charge storage layer 6. The interlayer insulating film 8 and the control gate 9 are formed on the conductive charge storage layer 6. The sidewall insulating films 13 are formed on both sides of the layered structure that is formed on the semiconductor substrate 1 and that consists of the tunnel insulating film 4, the insulative charge storage layer 5, the conductive charge storage layer 6 with the cavities 7b formed on both sides thereof, the interlayer insulating film 8, and the control gate 9.

Processes for manufacturing the nonvolatile semiconductor storage device according to the second modification of the first embodiment will now be described. FIGS. 8A to 8F are cross-sectional views showing processes for manufacturing the nonvolatile semiconductor storage device according to the second modification of the first embodiment. The processes of the second modification differ from those of the first embodiment in that the processes have a step of forming the cavity 7b on the side surfaces of the conductive charge storage layer 6.

Figure 8A:
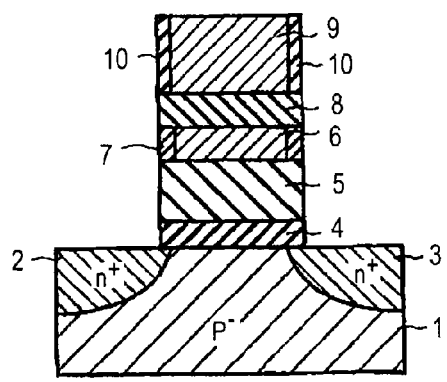
FIGS. 8A to 8F are cross-sectional views showing processes for manufacturing the nonvolatile semiconductor storage device according to the second modification of the first embodiment.
Figure 8B:
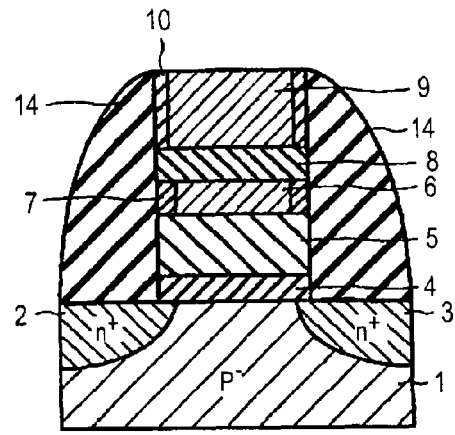

First, as shown in FIG. 8A, a layered structure consisting of the tunnel insulating film 4, the insulative charge storage layer 5, the conductive charge storage layer 6 with the metallic oxide films (the titanium oxide films) 7 formed on both sides thereof, the interlayer insulating film 8, and the control gate 9 with the insulating layers 10 of a silicon oxide film formed on both sides thereof is formed on the semiconductor substrate 1 under the manufacturing method shown in FIGS. 4A through 4D. Next, as shown in FIG. 8B, after deposited, an insulating film is anisotropically etched away, thereby forming sidewall insulating films 14 on the sides of the layered structure. A film, such as a silicon oxide film formed by CVD using TEOS, having an etching selectivity against polysilicon can be used for the sidewall insulating films 14.

Figure 8C:
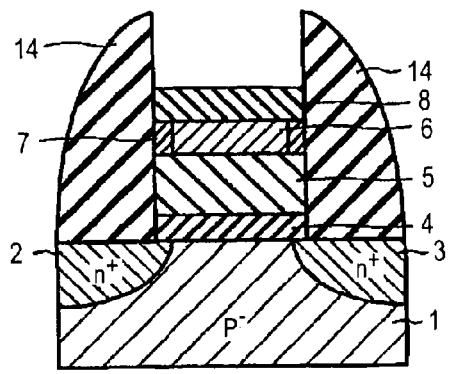
Figure 8D:
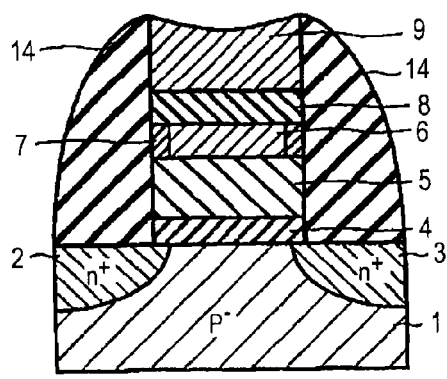
Figure 8E:
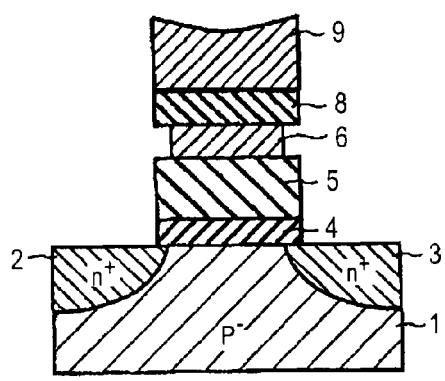
Figure 8F:
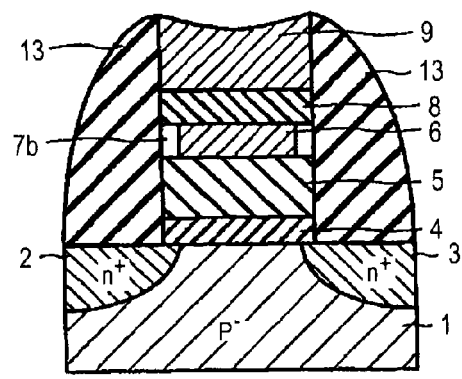

As shown in FIG. 8C, a polysilicon film that is to become the control gate 9 and the silicon oxide films 10 formed on both sides of the polysilicon film are etched away. Next, as shown in FIG. 8D, polysilicon is deposited by, for example, CVD, and etched back, thereby forming the control gate 9. As shown in FIG. 8E, the sidewall insulating film 14 and the metal oxide films 7 formed on both sides of the conductive charge storage layer 6 are etched away. As shown in FIG. 8F, an insulating film, such as a silicon oxide film, is deposited by CVD using TEOS, and the thus-deposited silicon oxide film is anisotropically etched, thereby forming sidewall insulating films 13 on both sides of the layered structure that is on the semiconductor substrate and that consists of the tunnel insulating film 4, the insulative charge storage layer 5, the conductive charge storage layer 6, the interlayer insulating film 8, and the control gate 9. Further, the cavities 7b are formed on both sides of the conductive charge storage layer 6. The cavities 7b rather than insulating films are formed on both sides of the conductive charge storage layer 6 for the same reasons as those mentioned in connection with the first modification of the first embodiment. As a consequence of the foregoing manufacturing processes, the nonvolatile semiconductor storage device according to the second modification of the first embodiment is fabricated as shown in FIG. 7.

Although the cavities 7b are formed on both sides of the conductive charge storage layer 6 in the second modification of the first embodiment, the metal oxide films 7 may also be left on both sides of the conductive charge storage layer 6. In this case, the manufacturing processes end at the process shown in FIG. 8D.

In the second modification of the first embodiment, when the cavities 7b are formed, both sides of the conductive charge storage layer 6 are oxidized, and resultant metallic oxides (titanium oxide films) 7 formed on both sides of the conductive charge storage layer 6 are etched away, to thus form the cavities. However, the cavities 7b may also be formed by selectively etching both sides of the conductive charge storage layer 6 while maintaining the insulative charge storage layer 5 by etching using a halogen-based element, such as chlorine. The nonvolatile semiconductor storage device according to the second modification of the first embodiment has the same advantage as that of the first embodiment.

Second Embodiment

Figure 9:
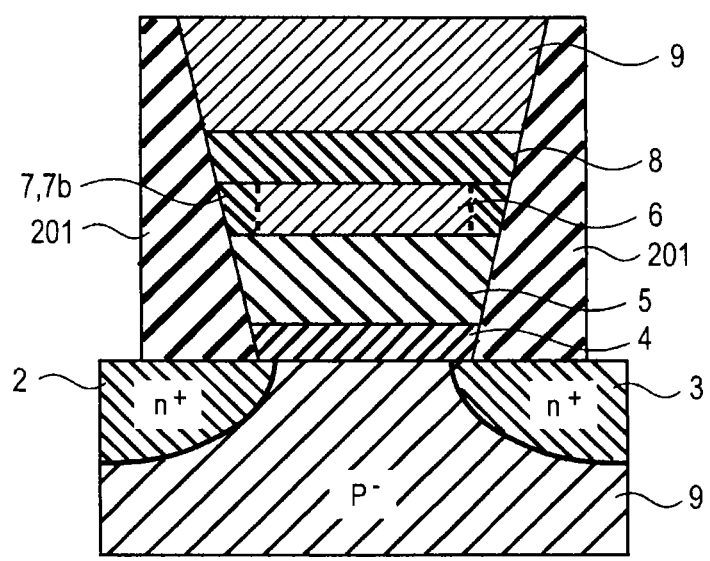
FIG. 9 is a cross-sectional view of a nonvolatile semiconductor storage device according to a second embodiment of the present invention.

FIG. 9 is a cross-sectional view of a nonvolatile semiconductor storage device according to a second embodiment of the present invention. The second embodiment differs from the first embodiment in that the control gate 9 is formed longer than the tunnel insulating film 4 in the channel direction.

In the nonvolatile semiconductor storage device according to the second embodiment, a layered structure consisting of the tunnel insulating film 4, the insulative charge storage layer 5, the conductive charge storage layer 6, the interlayer insulating film 8, and the control gate 9 is formed on the semiconductor substrate 1, and sidewall insulating films 201 are formed on both sides of the layered structure on the semiconductor substrate 1. The layered structure is formed so as to become continually narrow in the channel direction and formed into a tapered shape from the control gate 9 toward the tunnel insulating film 4. Further, the sidewall insulating films 201 are formed to sandwich tapered sides of the layered structure. The sidewall insulating films 201 are formed so as to become continually wider from the control gate 9 toward the tunnel insulating film 4.

In the nonvolatile semiconductor storage device according to the second embodiment, the layered structure consisting of the tunnel insulating film 4, the insulative charge storage layer 5, the conductive charge storage layer 6, the interlayer insulating film 8, and the control gate 9 is formed so that the channel direction width thereof is continually narrowed from the control gate 9 toward the tunnel insulating film 4, and the sidewall insulating films 201 are formed on the sides of the conductive charge storage layer 6, thereby lowering the capacitance between the conductive charge storage layers 6 of the adjacent elements and suppressing interference between the elements.

In the nonvolatile semiconductor storage device according to the second embodiment, the control gate 9 is formed so as to become longer than the tunnel insulating film 4 in the channel direction. Hence, an electric flux induced by the voltage of the control gate 9 can be concentrated on the semiconductor substrate 1, thereby effectively propagating the voltage from the control gate 9 to the semiconductor substrate 1.

The present invention is not limited to the foregoing embodiments. A nonvolatile semiconductor device according another embodiment, in which both of the first embodiment and the second embodiment are applied, for example, can be used. Specifically, as indicated by dotted lines in the conductive charge storage layer 6 shown in FIG. 9, a structure where the insulating layers 7 or the cavities 7b are provided on both sides of the conductive charge storage layer 6 as described in connection with the first embodiment can be used. In this case, in addition to the advantage described in connection with the second embodiment, it is also possible to suppress the capacitance between the conductive charge storage layers 6 of adjacent elements as described in connection with the first embodiment and to prevent interference between the adjacent elements.

The semiconductor substrate 1 is not limited to the silicon substrate, and a polysilicon substrate, a SiGe substrate, a Ge substrate, or a SiGeC substrate may also be employed. In addition, a substrate in which a p-type wells or a p-type semiconductor layer (SOI: Silicon-On Insulator), a SGOI (Silicon Germanium-On Insulator) layer, or a GOI (Germanium-On Insulator) layer is formed at a surface thereof can be used. Moreover, the source/drain region is imparted with an $n^+$-type, and the channel region is imparted with a $p^-$-type in the embodiments. However, the conductivity types may also be switched. Further, a depletion type structure in which a source/drain region and a channel region are imparted with the same conductivity type may also be adopted.

In addition, the present invention is not exactly limited to the embodiments and the examples and can be embodied in a practical phase by modifying constituent elements without departing from the range of the gist of the invention. Various inventions can be conceived by appropriate combinations of a plurality of constituent elements described in the embodiments and the examples. For instance, several constituent elements may also be deleted from the whole constituent elements provided in the embodiments and the examples. Further, constituent elements of the different embodiments and the examples may also be combined as appropriate.

According to an aspect of the present invention, a write characteristic of the nonvolatile semiconductor storage device can be enhanced, and interference between elements of the nonvolatile semiconductor storage device can be inhibited.

What is claimed is:

1. A nonvolatile semiconductor storage device, comprising:
   a semiconductor substrate;
   a tunnel insulating film formed on a channel region;
   a charge storage layer formed on the tunnel insulating film;
   an interlayer insulating film formed on the charge storage layer;
   a control gate formed on the interlayer insulating film; and
   an insulating film insulating a side wall of the charge storage layer, wherein the charge storage layer comprises:
      a conductive layer; and
      an insulating layer,
   wherein a width of the conductive layer is smaller than a width of the insulating layer, wherein the insulating film comprises:
      a portion insulating a side wall of the insulating layer; and
      a portion insulating a side wall of the conductive layer and a surface of the insulating layer at a side of the conductive layer, and
   wherein the portion insulating the side wall of the insulating layer and the portion insulating the side wall of the conductive layer and the surface of the insulating layer at the side of the conductive layer comprise the same material.

2. The nonvolatile semiconductor storage device of claim 1,
   wherein the control gate comprises a metal.

3. The nonvolatile semiconductor storage device of claim 1,
   wherein an insulating film comprising a silicon oxide film is formed from a side portion of the conductive layer along a region corresponding to the width of the insulating layer.

4. The nonvolatile semiconductor storage device of claim 3,
   wherein the control gate comprises a metal.

5. A nonvolatile semiconductor storage device, comprising:
   a semiconductor substrate;
   a tunnel insulating film formed on a channel region;
   a charge storage layer formed on the tunnel insulating film;
   an interlayer insulating film formed on the charge storage layer;
   a control gate formed on the interlayer insulating film; and
   an insulating film insulating a side wall of the charge storage layer, wherein the charge storage layer comprises:
      a conductive layer comprising a polysilicon; and
      an insulating layer comprising at least one of a silicon nitride and a hafnium oxide, wherein a width of the conductive layer is smaller than a width of the insulating layer, wherein the insulating film comprises:
         a portion insulating a side wall of the insulating layer; and a portion insulating a side wall of the conductive layer and a surface of the insulating layer at a side of the conductive layer, and wherein the portion insulating the side wall of the insulating layer and the portion insulating the side wall of the conductive layer and the surface of the insulating layer at the side of the conductive layer comprise the same material.

6. The nonvolatile semiconductor storage device of claim 5 wherein the control gate comprises a metal.

7. The nonvolatile semiconductor storage device of claim 5,
wherein an insulating film comprising a silicon oxide film is formed from a side portion of the conductive layer along a region corresponding to the width of the insulating layer.

8. The nonvolatile semiconductor storage device of claim 7,
wherein the control gate comprises a metal.

* * * * *